(12) United States Patent
Matsumoto et al.

(10) Patent No.: US 9,496,839 B2
(45) Date of Patent: Nov. 15, 2016

(54) AUDIO PROCESSING APPARATUS, REPRODUCTION APPARATUS, AUDIO PROCESSING METHOD AND PROGRAM

(75) Inventors: Takashi Matsumoto, Ota (JP); Akira Hattori, Yokohama (JP); Ichiro Sugai, Kawasaki (JP)

(73) Assignee: PIONEER DJ CORPORATION, Kanagawa (JP)

( * ) Notice: Subject to any disclaimer, the term of this patent is extended or adjusted under 35 U.S.C. 154(b) by 75 days.

(21) Appl. No.: 14/344,240

(22) PCT Filed: Sep. 16, 2011

(86) PCT No.: PCT/JP2011/005237
§ 371 (c)(1),
(2), (4) Date: Mar. 11, 2014

(87) PCT Pub. No.: WO2013/038459
PCT Pub. Date: Mar. 21, 2013

(65) Prior Publication Data
US 2014/0341395 A1    Nov. 20, 2014

(51) Int. Cl.
*H03G 3/04*    (2006.01)
*H03G 3/20*    (2006.01)
*G10H 5/00*    (2006.01)
*G10D 13/02*   (2006.01)
*G10H 1/00*    (2006.01)
(Continued)

(52) U.S. Cl.
CPC ............... *H03G 3/20* (2013.01); *G10D 13/02* (2013.01); *G10H 1/0008* (2013.01); *G10H 1/125* (2013.01); *G10H 3/146* (2013.01); *G10H 5/005* (2013.01); *G10H 2210/051* (2013.01); *G10H 2210/056* (2013.01); *G10H 2210/321* (2013.01); *G10H 2230/291* (2013.01); *G10H 2250/025* (2013.01); *G10H 2250/435* (2013.01); *H03G 5/02* (2013.01)

(58) Field of Classification Search
CPC ............. H03G 3/20; H03G 5/025; H03G 5/02
USPC ............................. 381/104–109, 118–119, 27
See application file for complete search history.

(56) References Cited

U.S. PATENT DOCUMENTS 7,893,339 B2    2/2011  Hasebe
8,295,499 B2 *  10/2012 Shirakawa ............ G10L 19/025
                                                        381/106
(Continued)

FOREIGN PATENT DOCUMENTS

JP         63-8698 A      1/1988
JP     2000-137485 A      5/2000
(Continued)

OTHER PUBLICATIONS

International Search Report dated Nov. 15, 2011; International Application No. PCT/JP2011/005237.

*Primary Examiner* — Disler Paul
(74) *Attorney, Agent, or Firm* — Young & Thompson

(57) ABSTRACT

The disclosed apparatus extracts particular instrument sounds included in music in real time during music reproduction. The audio processing section 12 has an attack decision section 42 that decides attack positions of the bass drum sounds in audio signals, a bass drum sounds decision section 43 that decides sound periods of the bass drum in the audio signals, and a bass drum sounds extraction section 44 that extracts bass drum sounds using a time varying type filter for the attack positions and an adaptive type filter for the sound periods.

20 Claims, 11 Drawing Sheets

(51) Int. Cl.
*G10H 1/12* (2006.01)
*G10H 3/14* (2006.01)
*H03G 5/02* (2006.01)

(56) References Cited

U.S. PATENT DOCUMENTS

| | | | | |
|---|---|---|---|---|
| 8,855,334 | B1* | 10/2014 | Lavine | H04M 19/04 |
| | | | | 381/119 |
| 8,891,778 | B2* | 11/2014 | Brown | G10L 21/0208 |
| | | | | 381/103 |
| 2002/0172372 | A1* | 11/2002 | Tagawa | G06F 17/30017 |
| | | | | 381/56 |
| 2002/0172379 | A1* | 11/2002 | Cliff | G11B 27/002 |
| | | | | 381/119 |
| 2008/0060502 | A1 | 3/2008 | Hasebe | |
| 2008/0212799 | A1* | 9/2008 | Breitschadel | H03G 7/007 |
| | | | | 381/106 |
| 2010/0170382 | A1 | 7/2010 | Kobayashi | |
| 2011/0058685 | A1 | 3/2011 | Sagayama | |
| 2011/0085681 | A1* | 4/2011 | Hashimoto | H03G 7/002 |
| | | | | 381/107 |
| 2012/0125179 | A1 | 5/2012 | Kobayashi | |

FOREIGN PATENT DOCUMENTS

| | | |
|---|---|---|
| JP | 2008-65039 A | 3/2008 |
| JP | 2010-054802 A | 3/2010 |
| JP | 2010-134231 | 6/2010 |
| WO | 2009-110118 A1 | 9/2009 |

* cited by examiner

P(T) : amplification value
       in the target frequency band
       to be analyzed at the time of T th   : threshold value
       for attack decision Atk_flag : bass drum sounds
           attack detection flag

AUDIO PROCESSING APPARATUS, REPRODUCTION APPARATUS, AUDIO PROCESSING METHOD AND PROGRAM

TECHNICAL FIELD

The present invention relates to an audio processing apparatus which extracts particular sounds by particular percussions, a reproduction apparatus, an audio processing method and a program.

RELATED ART

There has been known an isolator 110 (a kind of equalizer using a band division filter) as a sound control method of each instrument in music (see FIG. 11). However, in case that a level of lower sounds is decreased by the isolator 110, bass sounds and bass drum sounds attenuate simultaneously. Thus, attenuation cannot be controlled per instrument such as attenuation of bass sounds only or attenuation of bass drum sounds only.

Then, Patent Document 1 as an example has been known as sound control method per instrument. In the Patent Document 1, a music analysis section analyzes waveforms of music data and extracts individual instrument sounds included in the music data. Specifically, labelled log spectrums in timeline are preliminary provided, existence probability in timeline distribution per instrument sounds is calculated by partial spectrums extracted from the log spectrums by predetermined time unit, and sound materials are extracted based on the timeline distribution.

[Patent Document 1] JP2010-134231A (see paragraphs [0079], [0216] to [0218], FIGS. 2, 73 and the like)

SUMMARY OF INVENTION

However, in the method of the Patent Document 1, preliminary analysis of the music data is necessary and instrument sounds cannot be extracted in real time during music reproduction. While, the method using the isolator can control sounds in real time, but cannot control per instrument.

In view of the above problems, it is an advantage of the invention to provide an audio processing apparatus which can extract particular instrument sounds included in music during music reproduction, a reproduction apparatus, an audio processing method and program.

Means for Solving the Problems

According to one aspect of the invention, there is provided an audio processing apparatus that extracts a particular sound by a particular percussion in real time from an input audio signal comprising: a sound period decision section that decides a sound period by the particular percussion; an attack decision section that decides an attack position of the particular sound in the audio signal; and a particular sound extraction section that extracts the particular sound using a time varying filter including an adaptive type filter having a different extraction rate in conjunction with volume change of the audio signal and a time varying type filter having fixed characteristic change from the attack position regardless of the volume change of the audio signal in combination, the particular sound extraction section applying the adaptive type filter on the sound period and applying the time varying type filter on the attack position.

In the audio processing apparatus above, the particular percussion is a bass drum, the sound period decision section decides a range in which a lower sound amplification level of the audio signal is beyond a decision threshold value and the attack position of the bass drum sound decided by the attack decision section is included as the sound period, and the decision threshold value is set higher based on bass volume of the audio signal.

In the audio processing apparatus above, the time varying type filter includes a first time varying type filter corresponding to an intermediate sound and a higher sound and a second time varying type filter corresponding to the intermediate and lower sounds and having a longer adaption period than the first time varying type filter.

In the audio processing apparatus above, the sound period decision section decides the sound period based on a decision result of the attack decision section and the bass volume of the audio signal.

In the audio processing apparatus above, a lower sound amplification detection section is further provided that uses complex data generated through a fast Fourier transformation to detect the lower sound amplification level of the audio signal, and the attack decision section decides the attack position based on the lower sound amplification level.

In the audio processing apparatus above, the particular percussion is a bass drum, a lower sound amplification detection section is further provided that detects the lower sound amplification level of the audio signal using a low-pass filter, and the sound period decision section decides the sound period based on the lower sound amplification level.

In the audio processing apparatus above, a bass sound extraction section is further provided that extracts the bass sound using the extracted bass drum sound as a particular sound and a high-pass filter.

In the audio processing apparatus above, a process treatment section is further provided that processes to treat at least one of the extracted bass drum sound and the bass sound.

In the audio processing apparatus above, the process treatment section processes to treat at least two or more than two process treatments among sound inversion, sound amplification, sound attenuation and an effect application.

In the audio processing apparatus above, an operation section is further provided that selectively implements either process treatment among the two or more than two process treatments.

In the audio processing apparatus above, the operation section is capable of adjusting process treatment amount for each process treatment.

According to another aspect of the invention, there is provided a reproduction apparatus of the invention comprising: each section of the audio processing apparatus as set forth above; an audio input section through which the audio signal is input; and an audio output section that outputs an audio signal after an audio process by the audio processing apparatus.

According to another aspect of the invention, there is provided an audio processing method that extracts a particular sound by a particular percussion in real time from an input audio signal implementing steps of: deciding a sound period by the particular percussion; deciding an attack position of the particular sound in the audio signal; and extracting the particular sound using a time varying filter including an adaptive type filter having a different extraction rate in conjunction with volume change of the audio signal and a time varying type filter having fixed characteristic change from the attack position regardless of the volume change of the audio signal in combination, the adaptive type filter applied on the sound period and the time varying type filter applied on the attack position in the particular sound extraction.

According to the other aspect of the invention, there is provided a program causing a computer to function as each section of the audio processing apparatus as set forth above.

A structure described below may be applied.

An audio processing apparatus of the invention comprises: a sound period decision section that decides a sound period by a particular percussion in an input audio signal; and a particular sound extraction section that extracts a particular sound by the particular percussion using an adaptive type filter having a different extraction rate in conjunction with volume change of the audio signal for the sound period.

According to another aspect of the invention, there is provided an audio processing method comprising steps of: deciding a sound period by a particular percussion in an input audio signal; and implementing to extract a particular sound by the particular percussion using an adaptive type filter having a different extraction rate in conjunction with volume change of the audio signal for the sound period.

According to these structures, by applying a simple process in which a sound period by a particular percussion is decided and an adaptive type filter is used for the sound period, it is possible to extract the particular sound by the particular percussion. Thus, it is possible to extract the particular instrument sound during music reproduction without the need for preliminary analysis of music data.

It is noted that the percussion includes not only a membranophone such as a bass drum, a snare and a timpani but also an idiophone such as castanets and cymbals.

In the audio processing apparatus above, it is preferable that an attack decision section that decides an attack position of the particular sound in the audio signal further be provided the particular sound extraction section extract the particular sound by the particular percussion using a time varying type filter on the attack position.

According to the structure, it is possible to extract the particular sound by the particular percussion with a simple process using the time varying type filter on the attack position. Further, the particular sound can be extracted more accurately by combining with the process using the adaptive type filter.

It is noted that the particular sound by the same percussion may be extracted using a filter having the time varying type filter and the adaptive type filter, instead of these filters used separately.

In the audio processing apparatus above, it is preferable that a lower sound amplification detection section that detects a lower sound amplification level of the audio signal further be provided and the particular percussion be a bass drum, and the attack decision section decide the attack position based on the lower sound amplification level.

According to the structure, only the bass drum sound can be extracted from the audio signal. Further, the attack position of the bass drum can be decided more correctly by deciding the attack position based on the lower sound amplification level.

In the audio processing apparatus above, it is preferable that the sound period decision section decide the sound period based on a decision result of the attack decision section and bass volume of the audio signal.

According to the structure, only the bass drum sound can be extracted more precisely by deciding the sound period in consideration of volume of the bass as a lower sound band instrument.

It is noted that the sound period decision section preferably decides such that the sound period becomes shorter when the bass volume is higher, compared with when the bass volume is lower. According to the structure, when only the bass drum sound needs to be attenuated in the audio signal, only the bass drum sound can be extracted effectively having the bass sound remained.

Further, the sound period decision section may decide the sound period based on the lower sound amplification level detected by the lower sound amplification detection section, in addition to the decision result of the attack decision section and the bass volume of the audio signal. For example, an extraction point may be decided based on the attack position, and a starting point and an end point of the sound period including the extraction point may be decided based on the bass volume and the lower sound amplification level.

In the audio processing apparatus above, it is preferable that the lower sound amplification detection section detect the lower sound amplification level of the audio signal using complex data generated through fast Fourier transformation.

According to the structure, the lower sound amplification level can be detected more exactly, compared with a case the lower sound amplification level of the audio signal is detected with a low-pass filter.

In the audio processing apparatus above, it is preferable that a lower sound amplification detection section that detects a lower sound amplification level of the audio signal using a low-pass filter further be provided, and the particular percussion be a bass drum, and the sound period decision section decide the sound period based on the lower sound amplification level.

According to the structure, the lower sound amplification level can be detected with a simpler process, compared with a case where the lower sound amplification level of the audio signal is detected through the fast Fourier transformation. Therefore, process delay is less and a real time characteristic can be enhanced when the particular sound is extracted during music reproduction.

In the audio processing apparatus above, it is preferable that a bass sound extraction section that extracts a bass drum sound extracted as the particular sound and a bass sound using a high-pass filter further be provided.

According to the structure, only the bass sound can be extracted from the audio signal.

In the audio processing apparatus above, it is preferable that a process treatment section that processes to treat at least one of the extracted bass drum sound and the bass sound further be provided.

In the audio processing apparatus above, it is preferable that the process treatment section treat to process at least two or more than two process treatments among sound inversion, sound amplification, sound attenuation and an effect application.

In the audio processing apparatus above, it is preferable that an operation section that selectively implements either process treatment among the two or more than two process treatments further be provided.

In the audio processing apparatus above, it is preferable that the operation section be capable of adjusting process treatment amount for each process treatment.

According to these structures, a user's desired process treatment can be applied on the extracted bass drum sound and/or bass sound among a plurality kinds of process treatments. Further, a user can adjust based on preference such as sound amplification amount, sound attenuation amount an effect level.

It is noted that the "sound attenuation" is a concept including "sound elimination (an attenuation rate at a maximum)".

Further, various effect processes used for DJ devices or the like can be applied such as delaying, reverbing as the "effect application".

According to another aspect of the invention, there is provided a reproduction apparatus comprising: each section of the audio processing apparatus above; an audio input section through which the audio signal is input; and an audio output section that outputs an audio signal after an audio process by the audio processing apparatus.

According to the structure, it is possible to realize a reproduction apparatus which is capable of extracting a particular instrument sound included in music in real time during music reproduction.

According to the other aspect of the invention, there is provided a program that causes a computer to function as each section of the audio processing apparatus as set forth above.

By using the program, it is possible to realize an audio processing apparatus which is capable of extracting a particular instrument sound included in music during music reproduction.

DETAILED DESCRIPTION OF THE INVENTION

An audio processing apparatus, a reproduction apparatus, an audio processing method and a program according to an embodiment of the invention will be explained with reference to accompanying drawings. The invention is characterized by extracting particular sounds by particular percussions in music during music reproduction. A "bass drum" is exemplified as particular percussion and a case in which "bass drum sounds" are extracted as particular sounds will be explained.

[First Embodiment]

Figure 1:
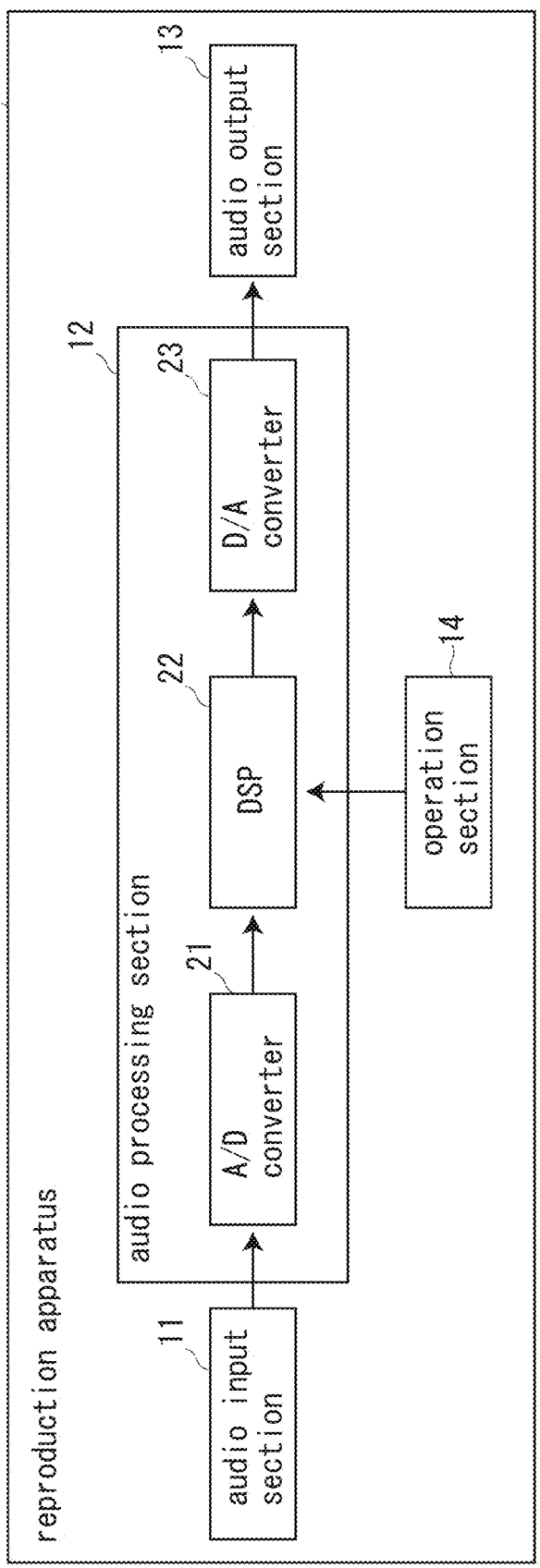
FIG. 1 is a block diagram as a whole of a reproduction apparatus according to an embodiment of the invention.

FIG. 1 illustrates a block diagram of a reproduction apparatus 1 as a whole. The reproduction apparatus 1 has an audio input section 11 which is input with sound signals (audio signals), an audio processing section 12 which performs various audio processes on the audio signals, an audio output section 13 which outputs audio signals after the audio processes and an operation section 14 by which a user performs various operations. A DJ device (such as a DJ player and a DJ mixer), an audio device (such as a CD player and a DVD player), a portable audio player, a smartphone, a recording device and a broadcasting device can be applied as the reproduction device 1. An "audio processing apparatus" in claims includes the audio processing section 12 and the operation section 14.

In case that the reproduction apparatus 1 reproduces optical discs, the audio input section 11 is input with audio signals output from an optical disc drive. Further, in case that audio signals can be read out from recording media such as USB memory, audio signals therefrom are input. Still further, audio signals may be input via a network. In case that the reproduction apparatus 1 has built-in speakers, the audio output section 13 indicates an amplifier and speakers, and the reproduction apparatus 1 does not have built-in speakers, the audio output section 13 indicates an output interface.

The audio processing section 12 includes an A/D converter 21, a DSP 22 (Digital Signal Processor) and a D/A converter 23. In case that the audio input section 11 acquires digital signals, the A/D converter 21 and the D/A converter 23 are not necessary.

Figure 2:
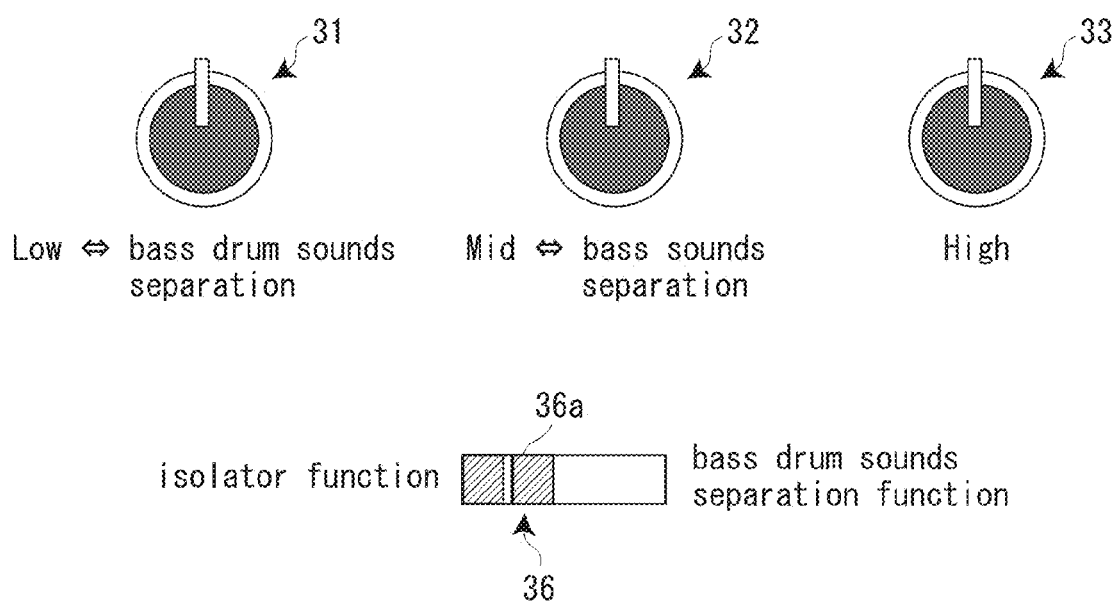
FIG. 2 is an explanatory view for operation section.

The operation section 14 includes rotary type operators 31, 32 and 33 and a slide switch 36 as illustrated in FIG. 2. The slide switch 36 is used to switch the rotary type operators 31, 32 and 33 as "isolator function" or as "bass drum sounds separation function". For example, when a moving operator 36a is moved to the left side (the "isolator function" side), the rotary type operators 31, 32 and 33 function as isolators. Thus, they function as adjusting knob for lower sounds 31, adjusting knob for intermediate sounds 32 and adjusting knob for higher sounds 33, respectively.

When the moving operator 36a is moved to the right side (the "bass drum sounds separation function" side), the rotary type operators 31 and 32 function as adjusting knob for bass drum sounds 31 and adjusting knob for bass sounds 32. For example, when the adjusting knob for bass drum sounds 31 is turned to the left side, only the bass drum sounds are gradually attenuated in the music being reproduced with its rotation amount. In the illustrated state, an attenuation rate is 0%, and the attenuation rate becomes 100% when the knob for bass drum sounds 31 is turned to the limit at the left side, which results in a state where the bass drum sounds are eliminated. On the contrary, when the adjusting knob for bass drum sounds 31 is turned to the right side, the number of the bass drum sounds gradually increases (delayed and added). Likewise, when the adjusting knob for bass sounds 32 is turned to the left side, only the bass sounds are gradually attenuated in the music being reproduced, and when the knob for bass sounds 32 is turned to the right side, the number of bass sounds gradually increases.

The operators can have any shape such as fader type without limited to the shape illustrated in FIG. 2, in place of the rotary type operators 31, 32 and 33. Further, a toggle switch or a button type switch which switches functions by pushing may be used in place of the slide switch 36.

Figure 3:
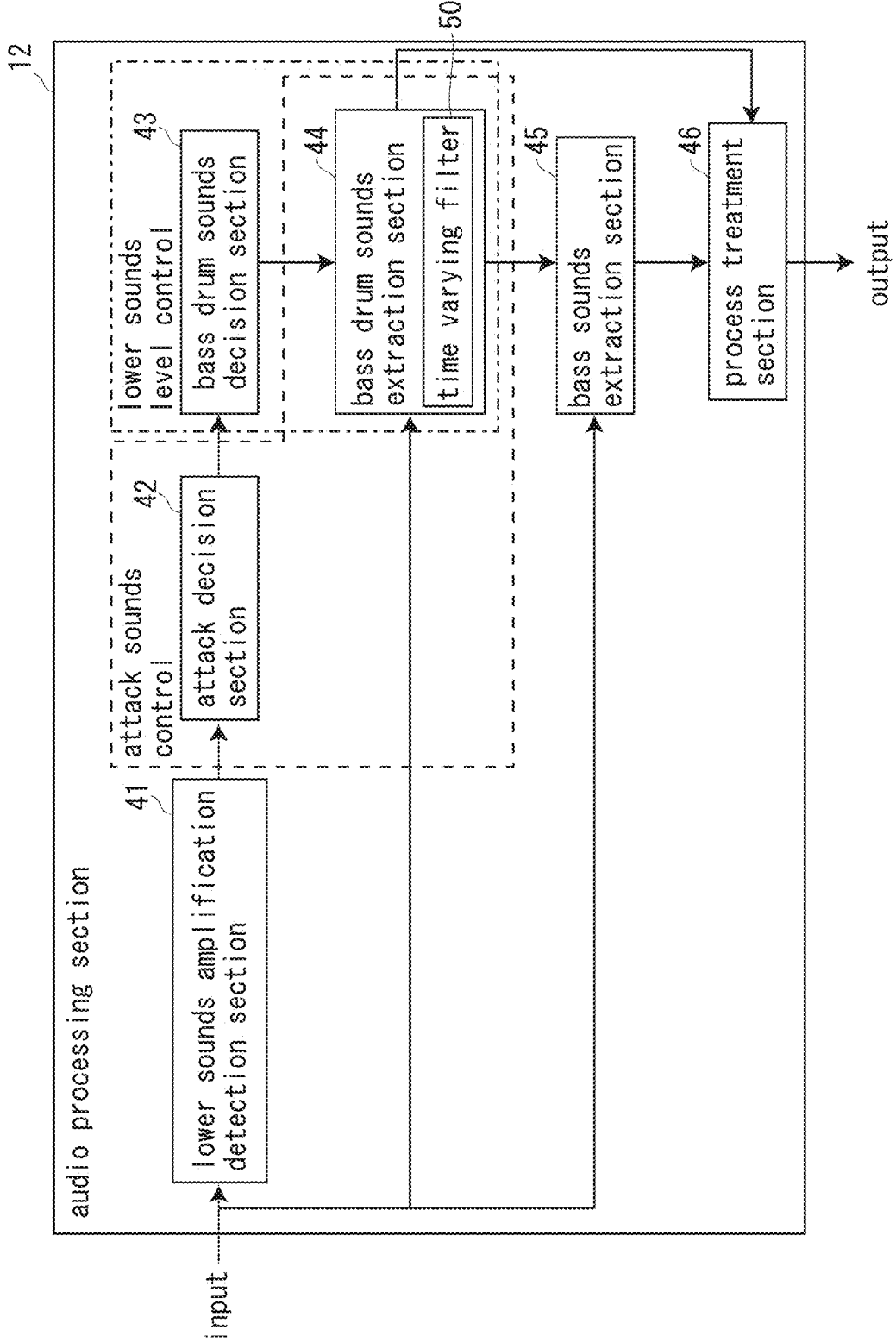
FIG. 3 is a detailed block diagram of an audio processing section according to the first embodiment.

Now, referring to FIGS. 3 to 7, functions of the audio processing section 12 will be explained in detail. FIG. 3 is a detailed block diagram of the audio processing section 12 according to the first embodiment. The audio processing section 12 has a lower sounds amplification detection section 41, an attack decision section 42, a bass drum sounds decision section 43 (sound period decision section), a bass drum sounds extraction section 44 (particular sounds extraction section), a bass sounds extraction section 45 and a processing treatment section 46. Each section in the audio processing section 12 has the DSP 22 (see FIG. 1) as main section.

The lower sounds amplification detection section 41 detects lower sounds amplification levels of the input audio signals. Thus, as illustrated in FIG. 4A, waveforms showing amplification volume change to a time axis are detected. In this embodiment, the "lower sounds" imply sounds equal or less than a few hundred Hz because the invention intends to extract the bass drum sounds.

The attack decision section 42 decides attack positions (positions when particular sounds are emitted) of the bass drum sounds in the input audio signals. The bass drum sounds decision section 43 decides lower sounds peak periods (sound periods) by the bass drum. The bass drum sounds extraction section 44 extracts the bass drum sounds from the input audio signals by a time varying filter 50. The time varying filter 50 is a filter corresponding to spectrum time change of the bass drum (see FIG. 7). In the explanation hereinbelow, control which extracts the bass drum sounds using a decision result of the attack decision section 42 and the time varying filter 50 is referred as an "attack sounds control" and control that extracts the bass drum sounds using a decision result of the bass drum sounds decision section 43 and the time varying filter 50 is referred as a "lower sounds level control".

Figure 8:
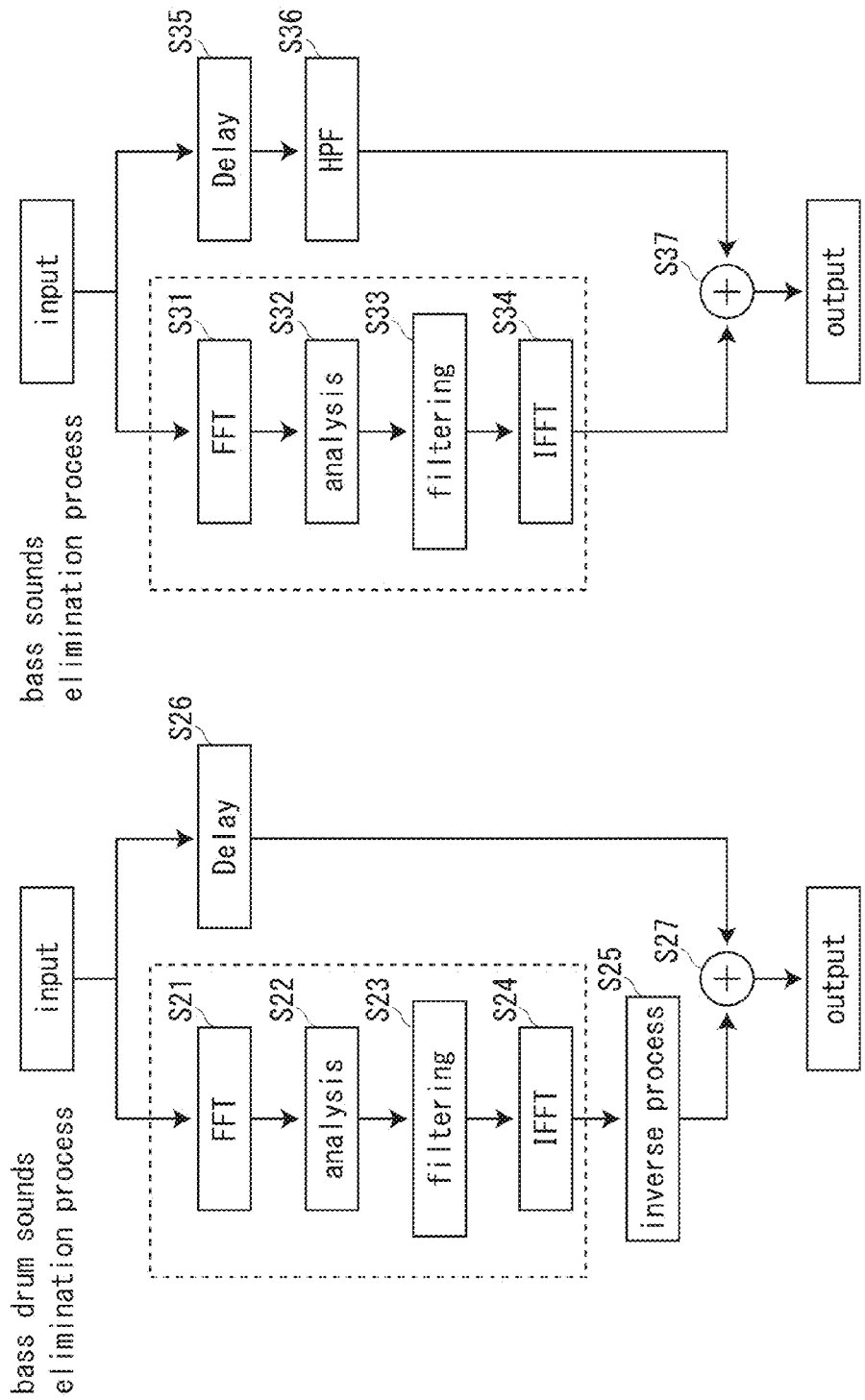
FIG. 8A is a process chart of a bass drum sounds elimination process and FIG. 8B is a process chart of a bass sounds elimination process according to the first embodiment.

The bass sounds extraction section 45 extracts the bass sounds in the input audio signals using the extracted bass drum sounds and a high-pass filter (see FIG. 8B). The processing treatment section 46 performs various process treatments (including an effect process) on the extracted bass drum sounds and/or the bass sounds. For example, sound attenuation and the effect process may be applied based on operations of the operation section 14 (the adjusting knob for the bass drum sounds 31, the adjusting knob for the bass sounds 32).

Figure 4:
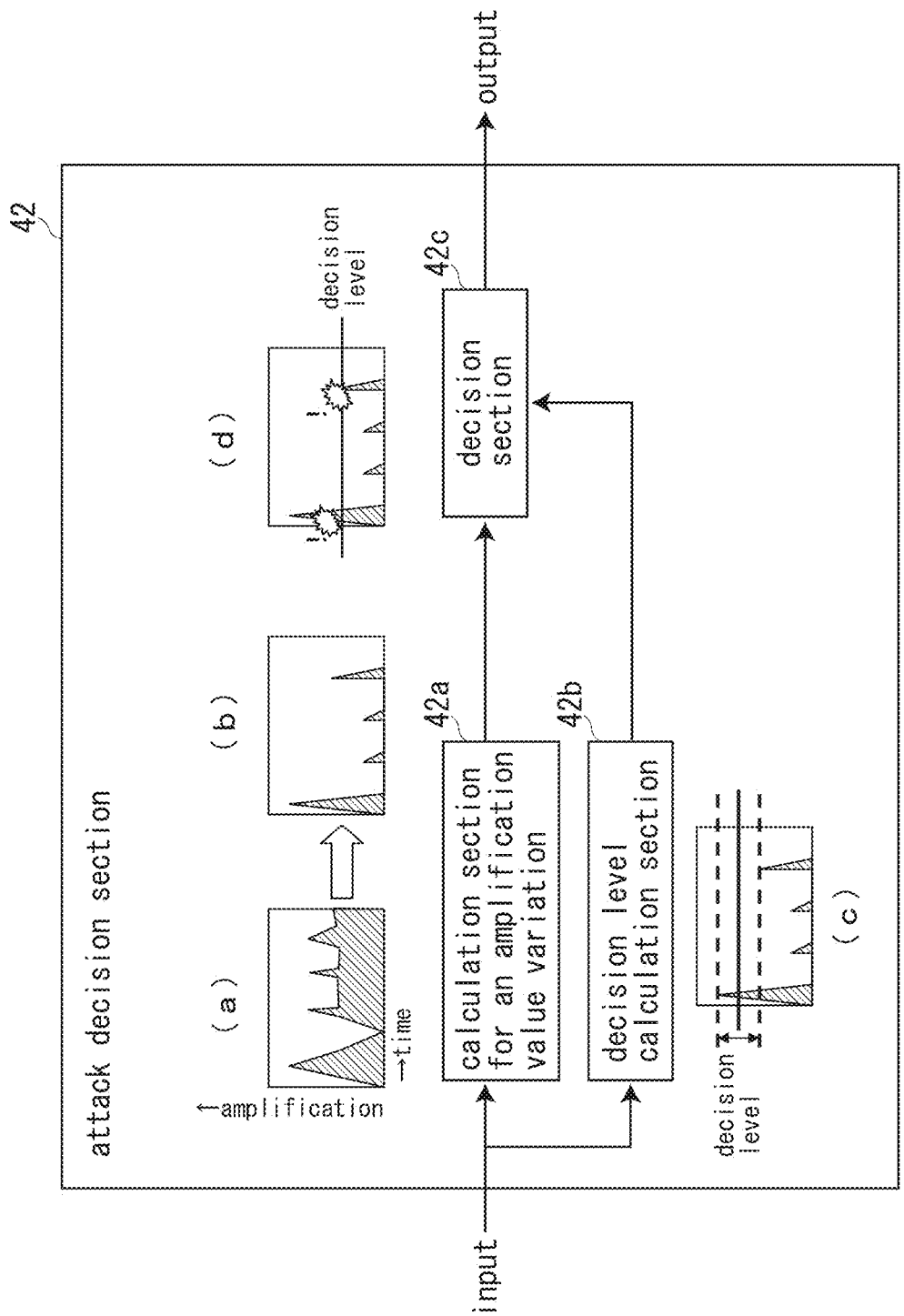
FIG. 4 is a detailed block diagram of an attack decision section in the audio processing section.

FIG. 4 is a detailed block diagram of the attack decision section 42. The attack decision section 42 has a calculation section for an amplification value variation 42a, a decision level calculation section 42b and a decision section 42c. The calculation section for an amplification value variation 42a calculates amplification value variation in a bass drum sounds band (target frequency band to be analyzed) (see (b) in FIG. 4). Thus, the calculation section 42a identifies bass drum sounds and other attack sounds (such as snare sounds and high-hat sounds) by detecting leading edges of lower sounds amplification values.

Figure 5:
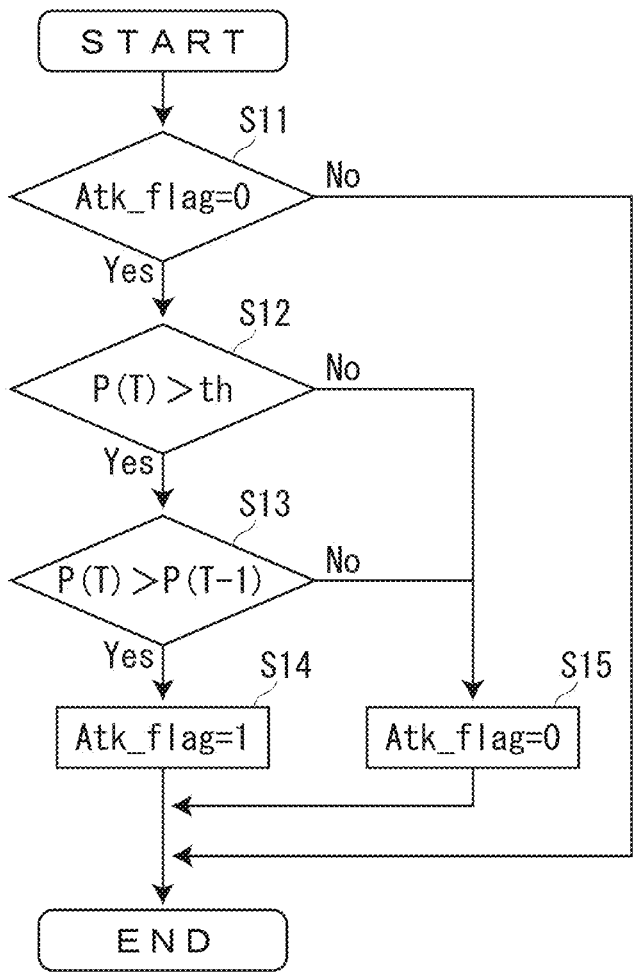
FIG. 5 is a flowchart illustrating an attack detection process.

FIG. 5 is a flowchart of an attack detection process by which attack positions of the bass drum sounds are detected. The calculation section for an amplification value variation 42a decides, as illustrated in FIG. 5, whether a bass drum sounds attack detection flag is "0" (S11), and when it is not "0" (S11: No), the attack detection process terminates.

While, the bass drum sounds attack detection flag is "0" (S11: Yes), whether an amplification value in the target frequency band to be analyzed at the time of T is larger than a threshold value for attack decision is decided (S12). When it is larger than the threshold value for attack decision (S12: Yes), whether the amplification value in the target frequency band to be analyzed at the time of T is larger than that at the time of (T-1) (S13). When it is larger than that at the time of (T-1) (S13: Yes), the bass drum sounds attack detection flag is set to "1" (S14).

While, when the amplification value in the target frequency band to be analyzed at the time of T is not larger than the threshold value for attack decision in S12, and when it is not larger than that at the time of (T-1), the bass drum sounds attack detection flag is set to "0" (S15). By the processes above, when the bass drum sounds attack detection flag is "1" (S14), an attack position is regarded to be detected and the time varying filter 50 (time varying type filter 52, see FIG. 7) is applied. After an extraction process for the bass drum sounds using the time varying filter 50 completes, the bass drum sounds attack detection flag is set to "0".

Referring back to the explanation of FIG. 4, the decision level calculation section 42b calculates decision levels based on the lower sounds amplification levels (sound volume of lower sounds) in music reproduction. When the lower sounds amplification levels are high, the decision levels become higher compared with a case where the lower sounds amplification levels are low. The decision section 42c decides the attack positions of the bass drum sounds based on the amplification value variation calculated by the calculation section for an amplification value variation 42a and the decision levels calculated by the decision level calculation section 42b. Specifically, as illustrated in (c) in FIG. 4, positions beyond the decision levels of the leading edges of the amplification values are decided as attack positions.

Figure 6:
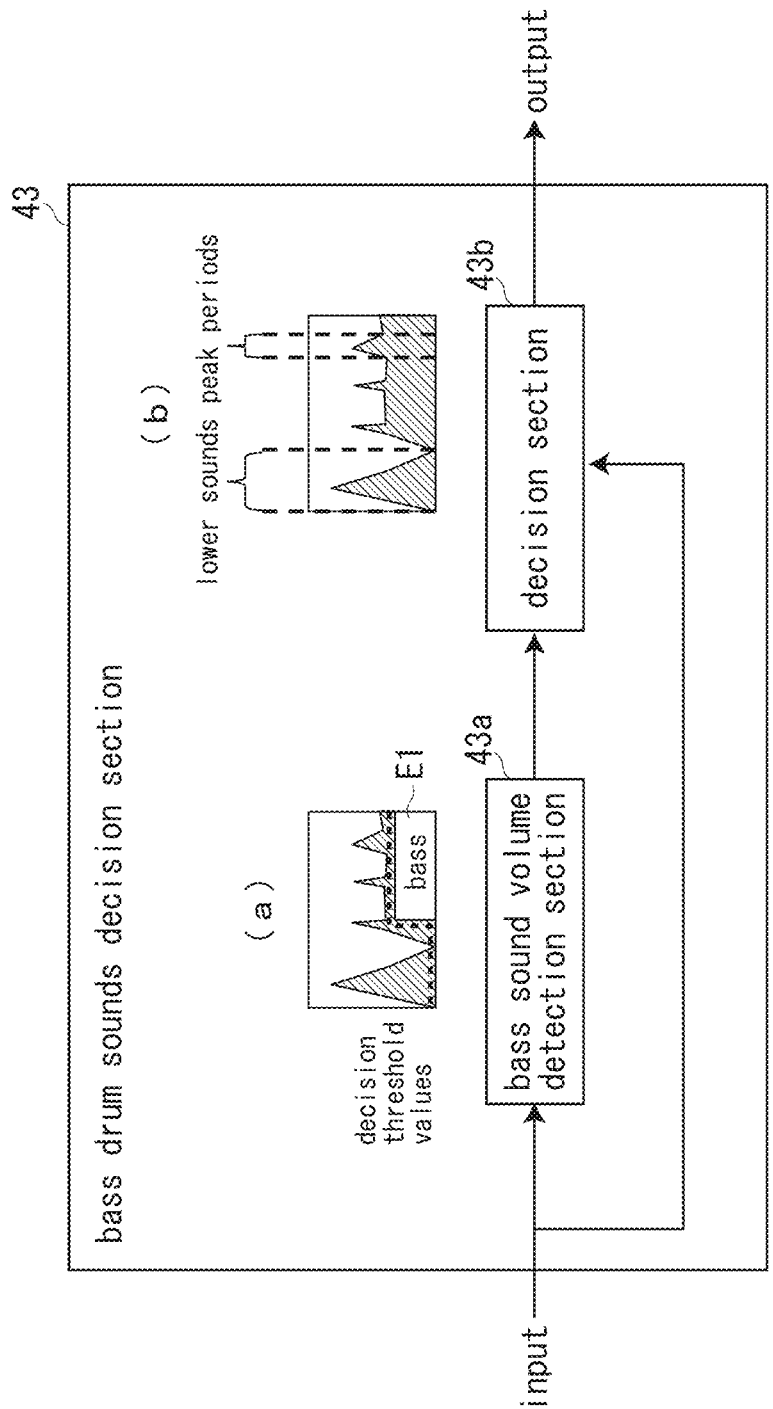
FIG. 6 is a detailed block diagram of a bass drum sound decision section in the audio processing section.

FIG. 6 is a detailed block diagram of the bass drum sounds decision section 43. The bass drum sounds decision section 43 has a bass sound volume detection section 43a and a decision section 43b. The bass sound volume detection section 43a detects bass sound volume included in the music (a region E1 in (a) in FIG. 6) by moving average deviations. A low-pass filter may be used instead of the moving average deviations. The bass sound volume is detected for calculating decision threshold values illustrated as dotted line in (a) in FIG. 6. The decision threshold values become higher with reference to loudness of the detected bass sound volume. When there are bass sounds, the decision threshold values become higher than when there are no bass sounds.

The decision section 43b decides a range where the amplification values detected by the lower sounds amplification detection section 41 is beyond the decision threshold value based on the bass sound volume detected by the bass sound volume detection section 43a and the attack positions of the bass drum sounds decided by the attack decision section 42 are included as lower sounds peak periods. In case of an example illustrated in (b) in FIG. 6, two ranges sandwiched by two dotted lines are lower sounds peak periods. Thus, since a portion including the bass sound volume has a higher decision threshold value than a portion without the bass sound volume, resulting in a shorter lower sounds peak period. Therefore, the decision section 43b can decide only sound periods of the bass drum sounds properly even if both of the bass sounds and the bass drum sounds are included in the music.

Figure 7:
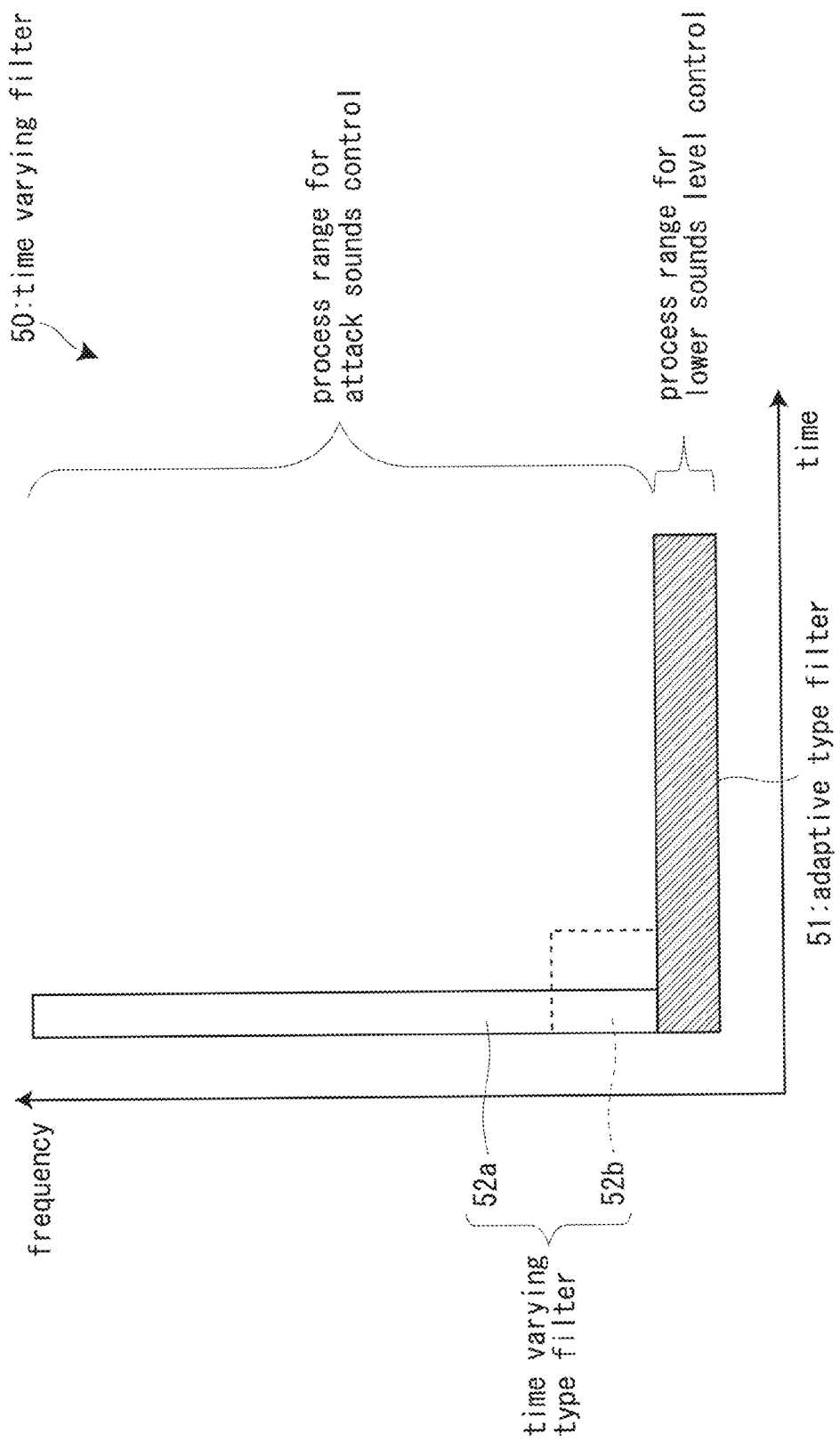
FIG. 7 is a view illustrating an example of a time-varying filter.

FIG. 7 is a diagram illustrating an example of the time varying filter 50. The time varying filter 50 changes its characteristics during the sound periods of the bass drum, and has an adaptive type filter 51 which has a process range for lower sounds level control and a time varying type filter 52 which has a process range for attack sounds control in combination. Thus, the adaptive type filter 51 is applied for the lower sounds peak periods (see (b) in FIG. 6) decided by the bass drum sounds decision section 43 and the time varying type filter 52 is applied for the attack positions decided by the attack decision section 42.

The adaptive type filter 51 controls to vary the attenuation rate in conjunction with the change of the lower sounds amplification levels. In other words, the adaptive type filter 51 changes its characteristics based on the input audio signals. While, the time varying type filter 52 has a fixed characteristics which varies from the attack positions regardless of the input audio signals. Further, the time varying type filter 52 has a first time varying type filter 52*a* corresponding to the intermediate sounds and the higher sounds and a second time varying type filter 52*b* corresponding to the intermediate and lower sounds. For example, in case that the bass drum sound needs to be eliminated in the input audio signals, these filters are used such that the first time varying type filter 52*a* is set at minus 10 dB and the second time varying type filter 52*b* is set at minus 15 dB. The time varying type filter 52 may control to change the attenuation rate in conjunction with the change of amplification levels as the adaptive type filter 51.

Now, referring to FIGS. 8A and 8B, a bass drum sounds elimination process and a bass sounds elimination process will be explained. FIG. 8A illustrates a process chart of the bass drum sounds elimination process. The audio processing section 12 generates complex data for analysis by applying the fast Fourier transformation on the input audio signals (S21) and analyzes using the complex data (S22). After the analysis, the time varying filter 50 is used for filtering (S23) to convert to time waveforms by the inverse fast Fourier transformation (S24). The bass drum sounds extraction process is performed by S21 to S24 above.

Then, by an inverse process (S25), the bass drum sounds are eliminated. While, in parallel with the bass drum sounds extraction process, a delay process is performed on the input audio signals (S26). The delay process is for making up for process delay by the bass drum sounds extraction process. Further, by applying an integration process (S27) of the audio signals after the delay process and signals after the inversion process in S25, audio signals in which only the bass drum sounds are eliminated in the input audio signals are output.

The analysis in S22 corresponds to the lower sounds amplification detection section 41, the attack decision section 42 and the bass drum sounds decision section 43 in the block diagram of FIG. 3. Further, the filtering in S23 corresponds to the bass drum sounds extraction section 44. Still further, the inversion process in S25 corresponds to the process treatment section 46.

FIG. 8B illustrates a process chart of the bass sounds elimination process. The audio processing section 12 applies the same processes (S31 to S34) as the bass drum sounds extraction processes (S21 to S24) illustrated in FIG. 8A. While, in parallel with the bass drum sounds extraction process, a delay process is applied on the input audio signals (S35), and filtering by the high-pass filter is applied (S36). Then, by applying an integration process 37 of the bass drum sounds (audio signals after the bass drum sounds extraction process) and the filtered audio signals, audio signals in which the bass sounds are eliminated in the input audio signals are output.

The filtering by the high-pass filter in S36 corresponds to a portion of the bass sounds extraction section 45 in the block diagram of FIG. 3. Thus, lower sounds are eliminated by passing the high-pass filter and the bass drum sounds and the bass sounds are eliminated. Then, the bass drum sounds which are extracted by the bass drum sounds extraction process are added, which can eliminate only the bass sounds, consequently.

As explained above, according to the first embodiment, it is possible to extract the bass drum sounds in real time from the ready-made music by a simple filtering process with the time varying filter 50. Thus, it is possible to realize the control and the process treatment of only the bass drum sounds without the need for preliminary analysis information. Further, it is possible to extract the bass sounds in real time from the ready-made music by combination of the bass drum sounds extraction process and the high-pass filter. In other words, the control and the process treatment of only the bass sounds can also be realized by applying the bass drum sounds extraction process.

Further, since the adaptive type filter 51 is applied to the lower sounds peak periods decided by the bass drum sounds decision section 43 and the type varying type filter 52 is applied to the attack positions decided by the attack decision section 42 (since the time varying filter 50 having two kinds of filters in combination is used), the bass drum sounds can be extracted more correctly.

Still further, since the lower sounds amplification levels are detected by the complex data generated through the fast Fourier transformation, the attack positions and the lower sounds peak periods can be decided more correctly, by which the bass drum sounds can be extracted with more precision.

[Second Embodiment]

Next, the second embodiment of the invention will be explained with reference to FIGS. 9 and 10. The embodiment is characterized by detecting the lower sounds amplification levels of the audio signals using a low-pass filter 60. Only portions different from those of the first embodiment will be explained hereinbelow. In the embodiment, same reference numerals are labeled for same elements as in the first embodiment and detailed explanations therefore are omitted. Modifications applied to the structures and portions as the first embodiment may also be applied to the embodiment.

Figure 9:
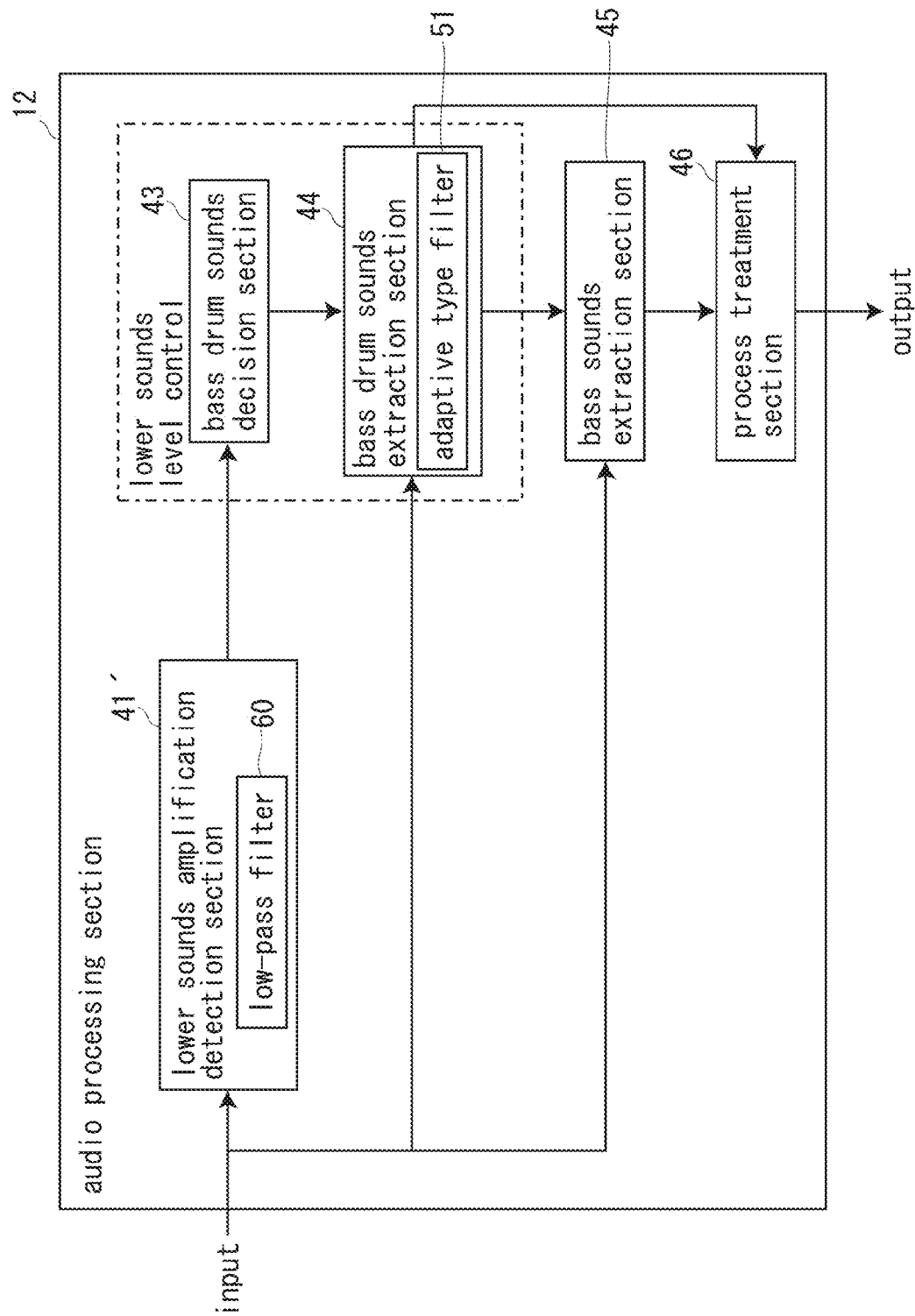
FIG. 9 is a detailed block diagram of the audio processing section according to the second embodiment.
Figure 10:
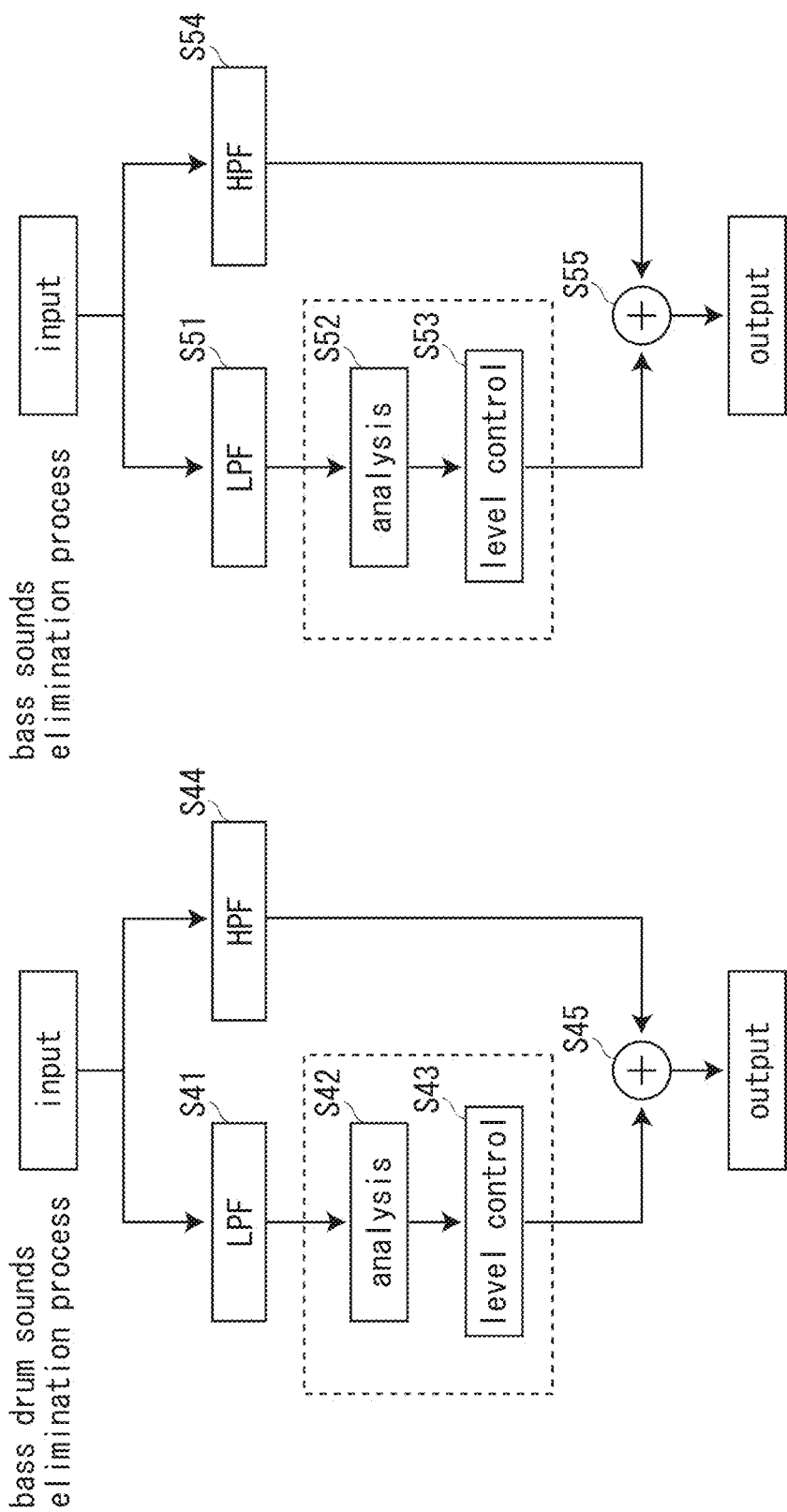
FIG. 10A is a process chart of a bass drum sounds elimination process and FIG. 10B is a process chart of a bass sounds elimination process according to the second embodiment.
Figure 11:
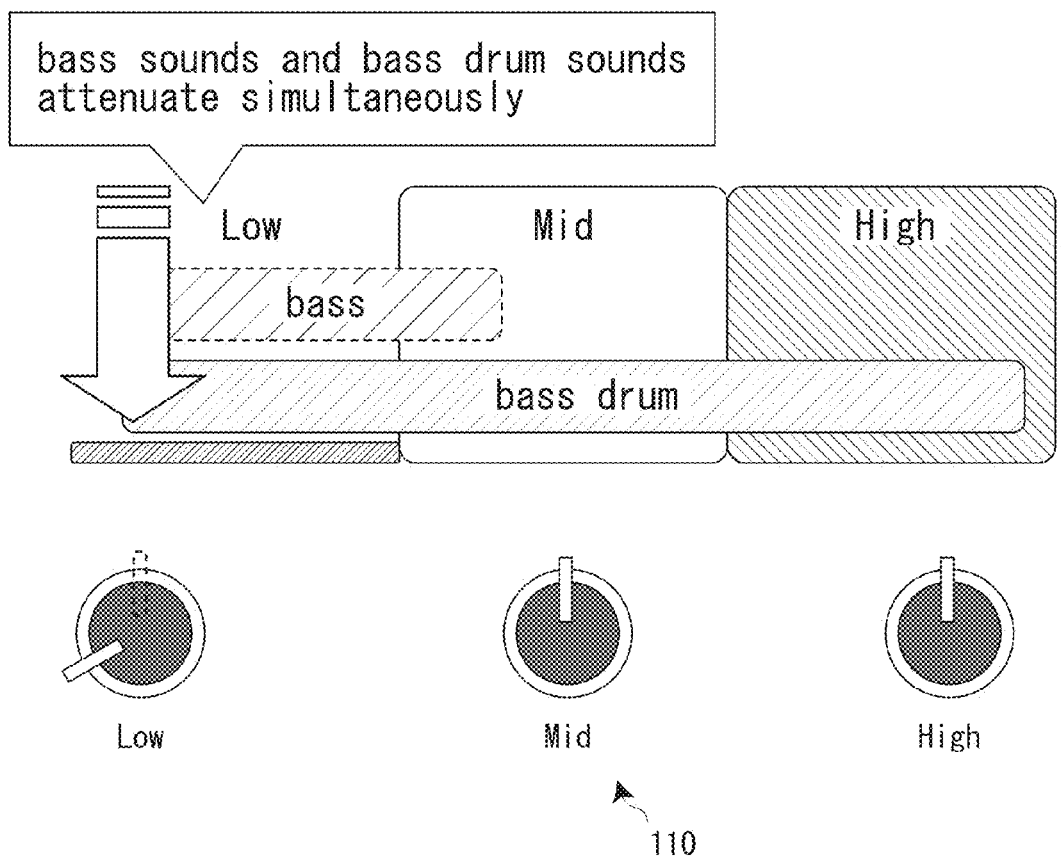
FIG. 11 is an explanatory view illustrating functions of a related isolator.

FIG. 9 illustrates a detailed block diagram of the audio processing section 12 according to the second embodiment. The audio processing section 12 of the embodiment has a structure where the attack decision section 42 is omitted, compared with the first embodiment (see FIG. 3). Therefore, a filter used in the bass drum sounds extraction section 44 in the second embodiment is the adaptive type filter 51 in which the time varying type filter 52 is omitted in the time varying filter 50 in the first embodiment (see FIG. 7). Further, a lower sounds amplification detection section 41' detects the lower sounds amplification levels of the audio signals using the low-pass filter 60.

FIGS. 10A and 10B are process charts illustrating the bass drum sounds elimination process and the bass sounds elimination process according to the second embodiment. FIG. 10A is the process chart illustrating the bass drum sounds elimination process. The audio processing section 12 detects the lower sounds amplification levels by filtering the input audio signals with the low-pass filter 60 (for example, Fc=200 Hz), and then, performs the analysis and the level control (S42, S43). As explained above, the bass drum sounds elimination process can be performed by S42 and S43.

While, in parallel with the bass drum sounds elimination process, the input audio signals are filtered with the high-pass filter (for example, Fc=200 Hz). The audio signals in which only the bass drum sounds are eliminated in the input audio signals are output by applying the integration process of the filtered audio signals and the audio signals after the bass drum sounds elimination process (S45).

The filtering of the low-pass filter 60 in S41 corresponds to a portion of the lower sounds amplification detection section 41' in the block diagram in FIG. 9. Further, the analysis in S42 corresponds to the lower sounds amplification detection section 41' and the bass drum sounds decision section 43. Still further, the level control in S43 corresponds to the bass drum sounds extraction section 44.

FIG. 10B illustrates a process chart of the bass sounds elimination process. The audio processing section 12 detects the lower sounds amplification levels by filtering with the low-pass filter 60 (for example, Fc=200 Hz) (S51), and then, performs the analysis and the level control (S52, S53). The level control in S53 controls to set the bass drum sounds to plus, which is different from the level control (S43) in FIG. 10A. In other words, the bass drum sounds extraction process is performed by S52 and S53.

While, in parallel with the bass drum sounds extraction process, the input audio signals are filtered with the high-pass filter (for example, Fc=400 Hz) (S54). It is noted that a cutoff frequency in S54 is different from that in S44 in FIG. 10A. Then, audio signals in which only the bass sounds are eliminated in the input audio signals are output by the integration process of the extracted bass drum sounds and the filtered audio signals (S55).

The filtering with the high-pass filter in S54 corresponds to a portion of the bass sounds extraction section 45 in the block diagram in FIG. 9. Thus, in the bass sounds elimination process in FIG. 10B, a band is separated by the low-pass filter 60 and the high-pass filter in S54 and the level control of the low-pass filter 60 is performed in the bass drum sounds extraction process. Therefore, by setting the output of the low-pass filter 60 to always "0", both low sound parts of the bass sounds and the bass drum sounds are eliminated. Then, by emitting sounds only when the bass drum sounds extracted by the bass drum sounds extraction process exist, the bass sounds can be eliminated accordingly.

As explained above, according to the second embodiment, it is possible to detect the lower sounds amplification levels with a simpler process using the low-pass filter 60. This makes the process delay little and can enhance the real time process when the particular sounds are extracted during music reproduction.

Two embodiments are explained above, and modifications below can be applied to each embodiment. For example, the "bass drum" is exemplified as a particular percussion in the above embodiments, but the invention can be applied to extract particular sounds by various percussions such as a "snare", a "timpani", "castanets", and "cymbals". Since bands in which sound component concentrates are different depending of percussion type, it is noted that bands for detecting amplification should be used properly based on a desired percussion to be extracted.

Further, in the above embodiment, though the attack decision section 42 identifies the attack sounds of the bass drum and other attack sounds by detecting the leading edges of the lower sounds amplification values (see FIG. 5), regarding target frequency bins to be analyzed, by adding difference when the amplification values increase respectively and by clearing when they decrease respectively to multiply data themselves after the processes, detection of the leading edges of the lower sounds amplification values may be regarded at points where each frequency bin rises in alignment. According to the structure, it is possible to decide attack positions of the bass drum more accurately.

Further, in the above embodiments, though the number of bass drum sounds is gradually increased by delaying the bass drum sounds when the adjusting knob for the bass drum sounds 31 is turned to the right (see FIG. 2), other effects may be applied. For example, parameters (process treatment volume) of various effects (such as reverberation, echo, and auto pan) generally used as DJ effects may be adjusted. The adjusting knob for the bass sounds 32 may be also the same.

Still further, in the above embodiments, though the bass drum sounds are gradually attenuated by turning the adjusting knob for the bass drum sounds 31 to the left, the bass drum sounds may be gradually increased (emphasized) by turning to the right on the contrary. Also, sounds may be inverted as the process treatment. A user may set at will types of process treatments allotted to the rotary type operators 31, 32 and 33, and rates of the process treatment volume to rotation amounts of the rotary type operators 31, 32 and 33.

Moreover, each section and each function in the reproduction apparatus 1 illustrated in each embodiment described above may be provided as a program. The program may be provided in various recording media (such as a CD-ROM, a flash memory) stored therein. In other words, The program and the recording media having the program therein for causing a computer to function as each section of the reproduction apparatus 1 are included in the scope of rights of the invention.

In the embodiment above, though the audio processing apparatus (audio processing section 12) of the invention is exemplified to adapt in the reproduction apparatus 1, the audio processing apparatus of the invention may be realized by a server on a network. In this case, a communication system is constructed with the server and a user terminal connected with the server via the network, the server serves as the audio processing section 12 in the embodiments above and the user terminal serves as the operator section 14. The invention may be applied to cloud computing. Thus, the reproduction apparatus 1 or the audio processing section 12 of the invention may be realized by an imaginary terminal using applications on the server.

The audio processing apparatus of the invention may be realized by PC applications or smartphone applications. In this case, the reproduction apparatus 1 may be implemented only by a computer installed with the PC applications or a smartphone installed with the smartphone applications. The apparatus structure of the reproduction apparatus 1, the treatment processes and the like of the invention may be modified without departing from the summary of the invention.

REFERENCE NUMERALS

1: reproduction apparatus 11: audio input section 12: audio processing section 13: audio output section 14: operation section 31: rotary type operator 36: slide switch 36a: moving operator 41: lower sounds amplification detection section 42: attack decision section 43: bass drum sounds decision section 44: bass drum sounds extraction section 45: bass sounds extraction section 46: process treatment section 50: time varying filter 51: adaptive type filter 52: time varying type filter 52a: first time varying type filter 52b: second time varying type filter 60: low-pass filter.

What is claimed is:

1. An audio processing apparatus that extracts a particular sound by a particular percussion in real time from an input audio signal comprising:
   a sound period decision section that decides a sound period by the particular percussion;
   an attack decision section that decides an attack position of the particular sound in the audio signal; and
   a particular sound extraction section that extracts the particular sound using a time varying filter, the time varying filter including an adaptive type filter in which an extraction rate of the particular sound varies with volume change of the input audio signal during the sound period, and a time varying type filter in which characteristics of extraction of the particular sound from the attack position vary over time from the attack position but not with the volume change of the input audio signal,
   wherein the particular sound extraction section applies the adaptive type filter during the sound period and applies the time varying type filter at the attack position.

2. The audio processing apparatus according to claim 1, wherein the particular percussion is a bass drum, the sound period decision section decides a range in which a lower sound amplification level of the audio signal is beyond a decision threshold value and the attack position of the bass drum sound decided by the attack decision section is included as the sound period, and the decision threshold value is set higher based on bass volume of the audio signal.

3. The audio processing apparatus according to claim 2, wherein the sound period decision section decides the sound period based on a decision result of the attack decision section and the bass volume of the audio signal.

4. A reproduction apparatus comprising:
   each section of the audio processing apparatus as set forth in claim 3;
   an audio input section through which the audio signal is input; and
   an audio output section that outputs an audio signal after an audio process by the audio processing apparatus.

5. The audio processing apparatus according to claim 2 further comprising a lower sound amplification detection section that uses complex data generated through a fast Fourier transformation to detect the lower sound amplification level of the audio signal, wherein the attack decision section decides the attack position based on the lower sound amplification level.

6. A reproduction apparatus comprising:
   each section of the audio processing apparatus as set forth in claim 5;
   an audio input section through which the audio signal is input; and
   an audio output section that outputs an audio signal after an audio process by the audio processing apparatus.

7. The audio processing apparatus according to claim 2 further comprising a bass sound extraction section that extracts the bass sound using an extracted bass drum sound as the particular sound with a high-pass filter.

8. The audio processing apparatus according to claim 7 further comprising a process treatment section that processes to treat at least one of the extracted bass drum sound and the bass sound.

9. The audio processing apparatus according to claim 8, wherein the process treatment section processes to treat at least two or more than two process treatments among sound inversion, sound amplification, sound attenuation and an effect application.

10. The audio processing apparatus according to claim 9 further comprising an operation section that selectively implements either process treatment among the two or more than two process treatments.

11. The audio processing apparatus according to claim 10, wherein the operation section is capable of adjusting process treatment amount for each process treatment.

12. A reproduction apparatus comprising:
   each section of the audio processing apparatus as set forth in claim 2;
   an audio input section through which the audio signal is input; and
   an audio output section that outputs an audio signal after an audio process by the audio processing apparatus.

13. The audio processing apparatus according to claim 1, wherein the time varying type filter includes a first time varying type filter corresponding to an intermediate sound and a higher sound and a second time varying type filter corresponding to the intermediate and lower sounds and having a longer adaption period than the first time varying type filter.

14. A reproduction apparatus comprising:
   each section of the audio processing apparatus as set forth in claim 13;
   an audio input section through which the audio signal is input; and
   an audio output section that outputs an audio signal after an audio process by the audio processing apparatus.

15. The audio processing apparatus according to claim 1 further comprising a lower sound amplification detection section that detects a lower sound amplification level of the audio signal using a low-pass filter, wherein the particular percussion is a bass drum, and the sound period decision section decides the sound period based on the lower sound amplification level.

16. The audio processing apparatus according to claim 15 further comprising a bass sound extraction section that extracts the bass sound using an extracted bass drum sound as the particular sound with a high-pass filter.

17. A reproduction apparatus comprising:
   each section of the audio processing apparatus as set forth in claim 15;
   an audio input section through which the audio signal is input; and
   an audio output section that outputs an audio signal after an audio process by the audio processing apparatus.

18. A reproduction apparatus comprising:
   each section of the audio processing apparatus as set forth in claim 1;
   an audio input section through which the audio signal is input; and
   an audio output section that outputs an audio signal after an audio process by the audio processing apparatus.

19. An audio processing method that extracts a particular sound by a particular percussion in real time from an input audio signal implementing steps of:
   deciding a sound period by the particular percussion;
   deciding an attack position of the particular sound in the audio signal; and
   extracting the particular sound using a time varying filter, the time varying filter including an adaptive type filter in which an extraction rate of the particular sound varies with volume change of the input audio signal during the sound period, and a time varying type filter in which characteristics of extraction of the particular sound from the attack position vary over time from the attack position but not with the volume change of the input audio signal, the adaptive type filter being applied during the sound period and the time varying type filter applied at the attack position in the particular sound extraction.

20. A non-transitory computer-readable medium comprising a program that causes a computer to function as each section of the audio processing apparatus as set forth in claim 1.

* * * * *